United States Patent [19]
Nishi et al.

[11] Patent Number: 5,447,825
[45] Date of Patent: Sep. 5, 1995

[54] METHOD FOR FORMING A PATTERN USING A PHOTOSENSITIVE COMPOSITION COMPRISING AN ALKALI-SOLUBLE RESIN MADE FROM A PHENOLIC COMPOUND AND AT LEAST TWO DIFFERENT ALDEHYDES

[75] Inventors: Mineo Nishi; Koji Nakano; Yoshihiro Takada, all of Kitakyushu, Japan

[73] Assignee: Mitsubishi Chemical Corporation, Tokyo, Japan

[21] Appl. No.: 299,079

[22] Filed: Aug. 31, 1994

Related U.S. Application Data

[62] Division of Ser. No. 948,422, Sep. 22, 1992, Pat. No. 5,372,909.

[30] Foreign Application Priority Data

Sep. 24, 1991 [JP] Japan .................. 3-243818

[51] Int. Cl.$^6$ .................. G03F 7/30; G03F 7/023
[52] U.S. Cl. .................. 430/326; 430/165; 430/190; 430/192; 430/193
[58] Field of Search ........... 430/190, 192, 326, 193, 430/165

[56] References Cited

U.S. PATENT DOCUMENTS

| | | | |
|---|---|---|---|
| 4,536,465 | 8/1985 | Uehara et al. | 430/192 |
| 4,943,511 | 7/1990 | Lazarus et al. | 430/192 |
| 5,087,548 | 2/1992 | Hosaka et al. | 430/192 |
| 5,279,918 | 1/1994 | Nishi et al. | 430/192 |

*Primary Examiner*—John S. V. Chu
*Attorney, Agent, or Firm*—Oblon, Spivak, McClelland, Maier & Neustadt

[57] ABSTRACT

A photosensitive resin composition comprising an alkali-soluble resin, a quinonediazide-type photosensitive compound and a solvent, as the main components, wherein the alkali-soluble resin is a polycondensation product of ① at least one phenolic compound of the following formula (A) and ② (a) formaldehyde and (b) at least one ketone or aldehyde of the following formula (B), and the mixing ratio of the formaldehyde (a) to the ketone or aldehyde (b) is within a range of from 1/99 to 99/1 in terms of the molar ratio of (a)/(b):

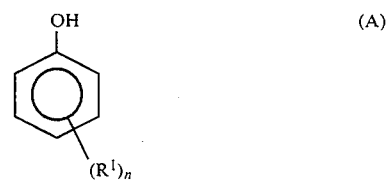

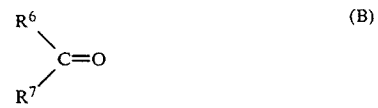

wherein $R^1$ is a group of the formula $R^2$, $OR^3$, $COOR^4$ or $CH_2COOR^5$, wherein $R^2$ is a $C_{1-4}$ alkyl group, each of $R^3$, $R^4$ and $R^5$ which are independent of one another, is a hydrogen atom or a $C_{1-4}$ alkyl group, n is an integer of from 0 to 3, provided that when n is 2 or 3, a plurality of $R^1$ may be the same or different, and each of $R^6$ and $R^7$ which are independent of each other, is a hydrogen atom, a $C_{1-4}$ lower alkyl group, an aryl group or an aralkyl group, provided that $R^6$ and $R^7$ are not simultaneously hydrogen atoms.

26 Claims, No Drawings

METHOD FOR FORMING A PATTERN USING A PHOTOSENSITIVE COMPOSITION COMPRISING AN ALKALI-SOLUBLE RESIN MADE FROM A PHENOLIC COMPOUND AND AT LEAST TWO DIFFERENT ALDEHYDES

This is a division of application Ser. No. 07/948,422, filed on Sep. 22, 1992, U.S. Pat. No. 5,372,909, allowed Jun. 16, 1994.

BACKGROUND OF THE INVENTION

1. Field of the Invention

The present invention relates to a photosensitive resin composition comprising an alkali-soluble resin, a quinonediazide-type photosensitive compound and a solvent, as the main components, which is sensitive to radiation such as ultraviolet rays, far ultraviolet rays, electron beams or X-rays. Further, the present invention relates to a method for forming a pattern using such a photosensitive resin composition.

2. Discussion of Background

Heretofore, a photoresist is known which comprises an alkali-soluble novolak resin and a quinonediazide-type photosensitive compound which is capable of functioning as an alkali dissolution inhibitor. With such a photoresist, at an irradiated portion, the quinonediazide-type photosensitive compound (hereinafter referred to simply as a photosensitive material) decomposes to carbene and then to a ketene, which reacts with a moisture within and outside the system to form indenecarboxylic acid, which is readily soluble in an aqueous alkaline solution. On the other hand, at a non-irradiated portion, the photosensitive material hinders solubility of the alkali-soluble novolak resin in the alkali developer (hereinafter such a hindering effect is referred to as a masking effect), whereby the non-irradiated portion is hardly soluble in an alkali developer, undergoes no substantial swelling and maintains a high film-remaining ratio. As a result, a resist pattern with a high resolution, can be obtained.

In recent years, high densification of semiconductor integrated circuits has progressed, and requirements for the production process have been increasingly severe. In order to fulfill such severe requirements, various improvements have been attempted with respect to photoresist materials, and detailed studies have been made on a wide range of materials including resins, photosensitive materials, developers and additives. Accordingly, requirements for a photoresist have also been increasingly high. In particular, high sensitivity, high resolution, high rectangularity of the pattern profile, high dry etching resistance, high heat resistance and a wide exposure margin are strongly desired.

Two types of expressions i.e. Eth and $E_0$ are used to express the sensitivity of a photoresist, and they are, respectively, defined as follows.

Eth: The minimum exposure required to dissolve the exposed portion over a wide area (e.g. at least $2\times 2$ mm) of a photoresist film coated on a substrate, completely to the substrate.

$E_0$: The exposure whereby, when developed by an alkali developer after exposure, a line pattern with a predetermined width (e.g. 0.6 μm) on a reticle can be reproduced with the desired size (e.g. 0.6 μm) on a wafer.

Eth is the minimum exposure whereby the exposed portion of a photoresist is dissolved to the substrate by development. Therefore, in order to form an image by the photoresist, an exposure of at least Eth is required. Further, in the actual process for producing semiconductors, an exposure ($E_0$) which is of course higher than Eth is employed to attain the desired line width corresponding to the size on the mask. It is said that the exposure margin can be widened by increasing the ratio of these two types of exposure i.e. the ratio of $E_0$/Eth. Namely, when the exposure exceeds $E_0$, the width of the line pattern will be smaller than the desired size, and when the exposure is less than $E_0$, the width of the line pattern will be larger than the desired size. Further, when the exposure is gradually reduced so that the exposure becomes smaller than Eth, it becomes impossible to dissolve the exposed portion to the substrate by development. Namely, it becomes impossible to form an image. When the ratio of $E_0$/Eth is small e.g. at a level of 1, if the exposure actually used is slightly smaller than $E_0$, the exposure will be less than Eth, whereby it becomes impossible to form an image, and accordingly, it will be difficult to produce semiconductors. Inversely, when the ratio $E_0$/Eth is large, the range of exposure for forming an image will be widened. Namely, it is thereby possible to widen the exposure margin.

On the other hand, photoresists for high resolution developed in recent years, are designed to improve the resolution and the exposure margin by increasing the masking effect by increasing the amount of the photosensitive material in the resists (e.g. Japanese Unexamined Patent Publication No. 136637/1987, Japanese Journal of Applied Physics Vol. 128, No. 10, Oct., 1989, p2110-2113). However, when the amount of the photosensitive material is increased, a decrease in the sensitivity can not be avoided. Absorption by the photosensitive material is high particularly in the i-line (wavelength: 365 nm) region which is commonly employed for semiconductor lithography in recent years. Accordingly, the difference in the energy of transmitted lights will be substantial between the upper and lower portions of the resist film coated on a wafer, whereby the pattern profile tends to be a trapezoid and can hardly be an ideal rectangle, and the resolution will hardly be satisfactory. If the amount of the photosensitive material is reduced to solve the above problems, no adequate masking effect will be obtained, and deterioration in the pattern profile, the resolution and the exposure margin will be remarkable, although the sensitivity may be improved. Thus, it is difficult to develop a high performance resist by conventional techniques, and a new concept is desired.

SUMMARY OF THE INVENTION

Under these circumstances, it is an object of the present invention to provide a photosensitive resin composition which is excellent in the pattern profile and the developing properties as compared with conventional products and which has a high resolution and a wide exposure margin.

It is another object of the present invention to provide a method for forming a pattern using such a photosensitive resin composition.

As a result of extensive studies to solve the above-mentioned problems, it has been found that a photosensitive resin composition employing a certain specific novolak resin i.e. a polycondensation product of at least one phenolic compound with formaldehyde and a specific ketone or aldehyde, as an alkali-soluble resin, has a high resolution and a wide exposure margin, as compared with a conventional-photosensitive resin composition employing a polycondensation product of a phenolic compound with formaldehyde, as the alkali-soluble resin. The present invention has been accomplished on the basis of this discovery.

Namely, the present invention provides a photosensitive resin composition comprising an alkali-soluble resin, a quinonediazide-type photosensitive compound and a solvent, as the main components, wherein the alkali-soluble resin is a polycondensation product of ① at least one phenolic compound of the following formula (A) and ② (a) formaldehyde and (b) at least one ketone or aldehyde of the following formula (B), and the mixing ratio of the formaldehyde (a) to the ketone or aldehyde (b) is within a range of from 1/99 to 99/1 in terms of the molar ratio of (a)/(b):

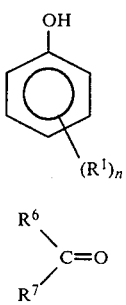

(A)

$$R^6 \diagdown C=O \atop R^7 \diagup$$ (B)

wherein $R^1$ is a group of the formula $R^2$, $OR^3$, $COOR^4$ or $CH_2COOR^5$, wherein $R^2$ is a $C_{1-4}$ alkyl group, each of $R^3, R^4$ and $R^5$ which are independent of one another, is a hydrogen atom or a $C_{1-4}$ alkyl group, n is an integer of from 0 to 3, provided that when n is 2 or 3, a plurality of $R^1$ may be the same or different, and each of $R^6$ and $R^7$ which are independent of each other, is a hydrogen atom, a $C_{1-4}$ lower alkyl group, an aryl group or an aralkyl group, provided that $R^6$ and $R^7$ are not simultaneously hydrogen atoms.

Further, the present invention provides a method for forming a pattern on a substrate for a semiconductor, which comprises coating such photosensitive resin composition on the substrate, subjecting it to exposure to copy a pattern and then developing it to form the pattern.

DETAILED DESCRIPTION OF THE PREFERRED EMBODIMENTS

Now, the present invention will be described in detail.

The photosensitive resin composition of the present invention is characterized by using a specific novolak resin as the alkali-soluble resin. The phenolic compound used as a component of such a novolak resin is represented by the above formula (A). In the formula (A), $R^1$ is a group represented by $R^2, OR^3, COOR^4$, or $CH_2COOR^5$ wherein $R^2$ is a $C_{1-4}$ alkyl group, and each of $R^3, R^4$ and $R^5$ which are independent of one another, is a hydrogen atom or a $C_{1-4}$ alkyl group. The $C_{1-4}$ alkyl group for $R^2, R^3, R^4$ and $R^5$ may for example, be a methyl group, an ethyl group, a n-propyl group, an i-propyl group or a n-butyl group. In the formula (A), n is an integer of from 0 to 3, provided that when n is 2 or 3, the plurality of $R^1$ may be the same or different.

The compound of the above formula (A) includes, for example, phenol, o-cresol, m-cresol, p-cresol, 2-ethylphenol, 3-ethylphenol, 4-ethylphenol, 2-isopropylphenol, 3-isopropylphenol, 4-isopropylphenol, 2-propylphenol, 3-propylphenol, 4-propylphenol, 2-t-butylphenol, 3-t-butylphenol, 4-t-butylphenol, 3,5-dimethylphenol, 2,5-dimethylphenol, 2,3-dimethylphenol, 3,4-dimethylphenol, 2,3-diethylphenol, 2,5-diethylphenol, 3,4-diethylphenol, 3,5-diethylphenol, 2-t-butyl-5-methylphenol, 2,3,5-trimethylphenol, 3,4,5-trimethylphenol, resorcinol, 2-methylresorcinol, 4-methylresorcinol, 5-methylresorcinol, catechol, 4-t-butylcatechol, pyrogallol, 2-methoxyphenol, 3-methoxyphenol, 4-methoxyphenol, 2-methoxyresorcinol, 2,3-dimethoxyphenol, 2,5-dimethoxyphenol, 3,5-dimethoxyphenol, 2-methoxy-5-methylphenol, gallic acid, methyl gallate, ethyl gallate, methyl 3-methoxy-4,5-dihydroxybenzoate, ethyl 3-methoxy-4,5-dihydroxybenzoate, methyl 4-methoxy-3,5-dihydroxybenzoate, ethyl 4-methoxy-3,5-dihyroxybenzoate, 3,4-dimethoxy-5-hydroxybenzoic acid, methyl 3,5-dimethoxy-4-hydroxybenzoate, ethyl 3,5-dimethoxy-4-hydroxybenzoate and 4-hydroxyphenylacetic acid.

It is preferred that in the above formula (A), $R^1$ is $R^2$, $OR^3$ or $CH_2COOR^5$, wherein each of $R^3$ and $R^5$ which are independent of each other, is a hydrogen atom or a $C_{1-4}$ alkyl group. Specifically, preferred are o-cresol, m-cresol, p-cresol, 3,5-dimethylphenol, 2,5-dimethylphenol, 2,3-dimethylphenol, 3,4-dimethylphenol, 2,3,5-trimethylphenol, 3,4,5-trimethylphenol, resorcinol, 2-methylresorcinol, pyrogallol and 4-hydroxyphenylacetic acid.

Particularly preferred is a compound of the formula (A) wherein $R^1$ is $R^2$ or $OR^3$, wherein $R^2$ is a $C_{1-2}$ alkyl group, and $R^3$ is a hydrogen atom.

When the carbon number of $R^2$ is 3 or more, there will be a deterioration in the heat resistance or the sensitivity. When $R^3$ is other than a hydrogen atom, a deterioration in the sensitivity tends to be remarkable.

Among the compounds of the formula (A), m-cresol, p-cresol, 2,5-dimethylphenol, 2-methylresorcinol and resorcinol are particularly preferred. Most preferred are ① a mixture comprising m-cresol, p-cresol, resorcinol and 2-methylresorcinol in a molar ratio of 1-7/1-7/0-2/0-2, and ② a mixture comprising m-cresol, p-cresol, 2,5-xylenol, resorcinol and 2-methyiresorcinol in a molar ratio of 1-7/1-7/0.1-7/0-2/0-2. Among photosensitive resin compositions employing alkali-soluble novolak resins obtained by polycondensing such phenol compounds with the after-mentioned formaldehyde and the ketone or aldehyde of the formula (B), improvement in the heat resistance is particularly remarkable when the mixture ① is employed, and improvement in the resolution is particularly remarkable when the mixture ② is used.

On the other hand, the ketone or aldehyde used as another component of the novolak resin is represented by the above formula (B). In the formula (B), each of $R^6$ and $R^7$ which are independent of each other, is a hydrogen atom, a $C_{1-4}$ lower alkyl group, an aryl group or an aralkyl group, provided that $R^6$ and $R^7$ are not simultaneously hydrogen atoms. The $C_{1-4}$ lower alkyl group for $R^6$ and $R^7$ may, for example, be a methyl group, an ethyl group, a n-propyl group, an i-propyl group and a n-butyl group; the aryl group may, for example, be a phenyl group; and the aralkyl group may, for example, be a benzyl group. Among the compounds of the above formula (B), the aldehyde may, for example, be an alkylaldehyde such as acetaldehyde, propionaldehyde or butylaldehyde, benzaldehyde and phenylacetaldehyde. The ketone may, for example, be acetone, ethyl methyl ketone, acetophenone or benzophenone. Among these compounds, an alkylaldehyde having a total carbon number of from 2 to 4, benzaldehyde and acetone are preferred. With an alkylaldehyde having a total carbon number of 5 or more, deterioration in the sensitivity tends to be remarkable, and it is thereby difficult to obtain a satisfactory alkali-soluble resin. Such ketones or aldehydes (b) represented by the formula (B) may be used alone or in combination as a mixture of them in optional proportions Among the compounds of the formula (B), acetaldehyde and propionaldehyde are particularly preferred. Acetaldehyde is especially preferred, since it has a practically high sensitivity, and it is thereby possible to attain a wide exposure margin.

In the present invention, formaldehyde (a) is used further as a component of the novolak resin. With respect to the mixing ratio of formaldehyde (a) to the ketone or aldehyde (b) of the formula (B), the molar ratio of (a)/(b) is required to be within a range of from 1/99 to 99/1. If the ketone or aldehyde (b) of the formula (B) is less than this range, no substantial improvement in the resolution and the exposure margin tends to be obtained. On the other hand, if the ketone or aldehyde (b) of the formula (B) exceeds the above range, the sensitivity deteriorates remarkably, and it tends to be difficult to obtain a satisfactory alkali-soluble resin. The molar ratio of (a) to (b) is preferably from 50/50 to 95/5, more preferably from 70/30 to 90/10, most preferably from 75/25 to 85/15. In the mixing ratio as defined above, the proportion of component (b) is the total proportion of ketones or aldehydes (b) of the formula (B). As a method for producing the above-described novolak resin, a method may be mentioned wherein the phenolic compound of the above formula (A), the ketone or aldehyde of the above formula (B) and formaldehyde are used in suitable amounts depending upon the molecular weight of the desired novolak resin, and they are mixed, heated and polycondensed, for example, in the presence of an acid catalyst in accordance with a conventional method. The acid catalyst may, for example, be an inorganic acid such as hydrochloric acid, nitric acid or sulfuric acid, or an organic acid such as formic acid, oxalic acid or acetic acid. These acids may be used alone or in combination as a mixture. In the polycondensation reaction of the present invention, a solvent for the reaction may not usually be required, but a solvent may be used. As such a solvent, an alcohol such as methanol, ethanol or propanol, or an ether such as ethylene glycol dimethyl ether or diethylene glycol dimethyl ether, may, for example, be mentioned. The reaction temperature varies depending upon the phenolic compound of the formula (A), but is usually within a range of from 10° to 200° C., preferably from 20° to 150° C. After completion of the reaction, it is common to increase the internal temperature to a level of from 150° to 250° C. and to distill off unreacted materials, the acid catalyst and water under reduced pressure, followed by withdrawing a molten novolak resin to obtain the desired novolak resin. In a case where a solvent for the reaction is employed, after completion of the reaction, the reaction mixture is added to a solvent such as water to precipitate the novolak resin, and the precipitate is collected by filtration and dried to obtain the desired novolak resin. In the present invention, such novolak resins may be used alone or in combination as a mixture of two or more of them, as the alkali-soluble resin. The weight average molecular weight as calculated as polystyrene (hereinafter referred to simply as MW) of the alkali-soluble resin of the present invention, is usually preferably from 2,500 to 30,000. If MW is less than 2,500, the heat resistance of the photosensitive resin composition tends to be poor. On the other hand, if it exceeds 30,000, the sensitivity tends to be remarkably poor. Particularly preferably, MW is within a range of from 3,000 to 20,000.

As the quinonediazide-type photosensitive compound to be used in the present invention, an esterification product of a quinonediazide sulfonic acid such as 1,2-benzoquinonediazide-4-sulfonic acid, 1,2-naphthoquinonediazide-4-sulfonic acid or 1,2-naphthoquinonediazide-5-sulfonic acid, particularly an esterified compound of 1,2-naphthoquinonediazide-4-sulfonic acid or an esterified compound of 1,2-naphthoquinonediazide-5-sulfonic acid, is preferred. An esterification product of the above-mentioned 4-sulfonic acid compounds are preferred in the case that the exposure is conducted with a light having a wavelength of from 330 to 420 nm. On the other hand, an esterification product of the above-mentioned 5-sulfonic acid compounds are preferred in the case that the exposure is conducted with a light having a wavelength of from 330 to 450 nm. Specifically, a 1,2-benzoquinonediazide-4-sulfonic acid ester, a 1,2-naphthoquinonediazide-4-sulfonic acid ester or a 1,2-naphthoquinonediazide-5-sulfonic acid ester of a compound or resin as identified in the following ①to ③, is preferably employed.

① A polyhydroxyaliphatic compound such as glycerol or pentaerythritol.

② A polyhydroxyaromatic compound such as bisphenol A, a gallic acid ester, kercetin, morin, polyhydroxybenzophenone or a trisphenol of the following formula (C):

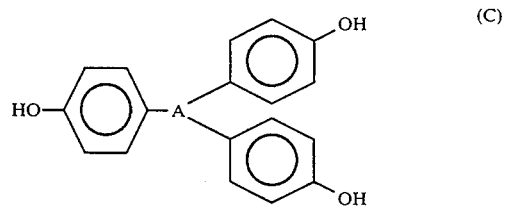

(C)

wherein A is

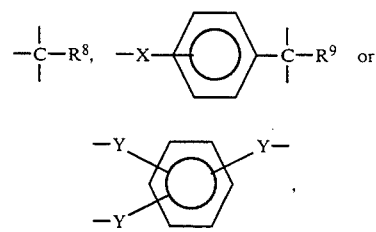

each of $R^8$ and $R^9$ is a hydrogen atom or a $C_{1-4}$ alkyl group, and each of —X— and —Y— is a $C_{1-4}$ alkylene group.

③ A phenol resin (hereinafter referred to as a ballast resin) obtained by dehydration condensation of a phenol with an aldehyde and/or ketone.

The esterification ratio, by quinonediazide sulfonic acid, of hydroxyl groups in the compound or resin of the above ① to ③ in the esterified product of such a quinonediazide sulfonic acid is usually from 30 to 100%, preferably from 40 to 100%.

Among the above-mentioned photosensitive compounds, a quinonediazide sulfonic acid ester of a polyhydroxyaromatic compound or a ballast resin is preferred. Particularly preferred is a quinonediazide sulfonic acid ester of polyhydroxybenzophenone, a trisphenol of the above formula (C) or a ballast resin.

The polyhydroxybenzophenone may, for example, be 2,3,4-trihydroxybenzophenone, 2,3,4,4'-tetrahydroxybenzophenone, 2,2',4,4'-tetrahydroxybenzophenone, 2,2',3,4,4'-pentahydroxybenzophenone or 2,3,3',4,4',5'-hexahydroxybenzophenone.

The ballast resin may, for example, be a resin which is obtained by polycondensing one or more phenolic compounds selected from the group consisting of alkylphenols such as phenol, o-cresol, m-cresol, p-cresol, 3-ethylphenol, p-t-butylphenol, 3,5-dimethylphenol, 2,5-dimethylphenol and 2,3,5-trimethylphenol, arylphenols such as o-hydroxydiphenyl and p-hydroxydiphenyl, resorcinols such as resorcinol, 2-methylresorcinol, 4-methylresorcinol, 5-methylresorcinol, 2-ethylresorcinol and 2,5-dimethylresorcinol, catechols such as catechol, 3-methylcatechol, 4-methylcatechol and 3,5-dimethylcatechol, and pyrogallols such as pyrogallol and 5-methylpyrogallol, with one or more ketones or aldehydes selected from the group consisting of aldehydes such as formaldehyde, acetaldehyde, propionaldehyde and benzaldehyde and ketones such as acetone, methyl ethyl ketone, diethyl ketone acetylbenzene and benzophenone. The weight average molecular weight of the resin used as the ballast resin is preferably within a range of from 400 to 2,200. If the molecular weight of this ballast resin is small, no adequate masking effect will be obtained, whereby it tends to be difficult to obtain a satisfactory pattern profile. On the other hand, if the molecular weight is large, the sensitivity tends to be remarkably poor. The molecular weight of the ballast resin is particularly preferably within a range of from 450 to 1,800. When the ballast resin is a polycondensation product of m-cresol with formaldehyde and/or acetaldehyde, excellent effects will be obtained particularly with respect to the resolution and the pattern profile.

As a method for producing such a ballast resin, a method may be employed wherein the phenolic compound and the ketone or aldehyde are heated and polycondensed in the presence of an acid catalyst at a temperature of from 50° to 100° C. in accordance with a conventional method.

In the present invention, the above-described photosensitive compounds may be used alone or in combination as a mixture of two or more of them.

As the solvent to be used in the present invention, any solvent may be used so long as it is capable of dissolving the above quinonediazide-type photosensitive compound and the alkali-soluble resin. Usually, the one having a boiling point of from 100° to 180° C. is preferred from the viewpoint of convenience for practical operation. The solvent may, for example, be an ether ester such as ethylcellosolve acetate, methylcellosolve acetate or propylene glycol monomethyl ether acetate, an ether alcohol such as ethylcellosolve, methylcellosolve or propylene glycol monomethyl ether, a carboxylic acid ester such as ethyl acetate or butyl acetate, a lactone such as γ-butyrolactone, a cyclic ketone such as cyclohexanone, a carboxylic acid ester of a dibasic acid such as diethyl oxalate or diethyl malonate, a dicarboxylic acid ester such as ethylene glycol diacetate or propylene glycol diacetate, or an oxycarboxylic acid ester such as ethyl 2-oxypropionate, ethyl 3-oxypropionate, methyl 3-methoxypropionate or ethyl 3-methoxypropionate. These solvents may be used alone or in combination as a mixture of two or more of them.

The concentration of the alkali-soluble resin in the photosensitive resin composition of the present invention is usually from 1 to 30% by weight. The concentration of the quinonediazide-type photosensitive compound is usually from 0.1 to 15% by weight. The proportion of the quinonediazide-type photosensitive compound relative to alkali-soluble resin is usually from 0.1 to 0.5 time by weight.

Further, to the photosensitive resin composition of the present invention, a surfactant such as a polyoxyethylene ether or a fluorinated alkyl ester, may be incorporated to prevent a coating defect such as striation, as the case requires. The amount of such a surfactant is usually not more than 2% by weight, preferably not more than 1% by weight. Further, a dye or the like may be added to minimize the influence of irregularly reflected lights from the substrate at the time of copying an image, and a sensitizer may be added to improve the sensitivity.

The photosensitive resin composition of the present invention is used in accordance with a conventional method through such steps as coating on a substrate, exposure to copy a pattern and development. The substrate on which the photoresist composition is coated, is a semiconductor substrate such as a silicon wafer. Coating of the photosensitive resin composition on such a substrate is conducted usually by means of a spin coater, and the film thickness of the photosensitive resin composition is usually from 0.3 to 5 μm. Usually, after coating the photosensitive resin composition, the substrate is heated on e.g. a hot plate to remove the solvent, and then exposure is conducted through a mask to form a desired pattern on the substrate. For the exposure, a light with a wavelength of from 330 to 450 nm such as g-line (436 nm) or i-line (365 nm), is preferably employed. After the exposure, the substrate is heated at a temperature of from 90° to 120° C for from 60 to 120 seconds, as the case requires, and then subjected to development with an aqueous alkaline solution. As the aqueous alkaline solution, an aqueous alkaline solution such as an aqueous solution of e.g. an inorganic alkali such as potassium hydroxide, sodium carbonate, sodium silicate, sodium methasiicate or aqueous ammonia, a primary amine such as ethylamine or n-propylamine, a secondary amine such as diethylamine or di-n-propylamine, or a tertiary amine such as triethylamine or trimethylamine, or a quaternary ammonium salt such as tetramethylammonium hydroxide or trimethylhydroxyethylammonium hydroxide, may preferably be employed. Further, an alcohol, a surfactant or the like may be incorporated to the developer, as the case requires.

The photosensitive resin composition of the present invention has a high level of resolution and a large exposure margin by virtue of the specific novolak resin used as the alkali-soluble resin, and it is useful particularly as a photoresist.

Now, the present invention will be described in further detail with reference to Examples. However, it should be understood that the present invention is by no means restricted by such specific Examples. In the following Examples, the molecular weight is a weight average molecular weight as calculated as polystyrene from the results of the analysis by gel permeation chromatography, and the esterification ratio is an esterification ratio obtained from the molar ratio of the charged starting materials.

NOVOLAK RESIN PREPARATION EXAMPLE 1

Into a 2 l separable flask, 237.91 g of m-cresol, 190.33 g of p-cresol, 53.75 g of 2,5-xylenol, 15 g of oxalic acid dihydrate and 1 ml of 35% hydrochloric acid were charged, and 31.8 g of 90% acetaldehyde was dropwise added thereto under stirring at room temperature. Then, stirring was continued at room temperature for 30 minutes. Then, the internal temperature was raised to 95° C., and 211.4 g of a 37% formalin aqueous solution was dropwise added thereto. The mixture was reacted for 5 hours while maintaining the temperature. Then, the internal temperature was raised to 180° C. over a period of 1.5 hours to conduct the reaction while distilling water off. After distilling water off, the internal temperature was further raised to 195° C., and unreacted monomers were distilled off under a reduced pressure of 20 Torr to obtain a novolak resin (a). The molecular weight of the novolak resin (a) was 8,000. The ratio of formaldehyde/acetaldehyde (charged molar ratio) was 8/2.

NOVOLAK RESIN PREPARATION EXAMPLE 2

A novolak resin (b) was prepared in the same manner as in Novolak Resin Preparation Example 1 except that the amounts of acetaldehyde and formalin were changed to 15.6 g of 90% acetaldehyde and 223.0 g of a 37% formalin aqueous solution, respectively. The molecular weight of the novolak resin (b) was 5,000. The ratio of formaldehyde/acetaldehyde (charged molar ratio) was 9/1.

NOVOLAK RESIN PREPARATION EXAMPLE 3

A novolak resin (c) was prepared in the same manner as in Novolak Resin Preparation Example 1 except that instead of acetaldehyde, 38.3 g of propionaldehyde was used, and 214.3 g of a 37% formalin aqueous solution was used. The molecular weight of the novolak resin (c) was 5,000. The ratio of formaldehyde/propionaldehyde (charged molar ratio) was 8/2.

NOVOLAK RESIN PREPARATION EXAMPLE 4

Into a 2 l separable flask, 237.91 g of m-cresol, 190.33 g of p-cresol, 53.75 g of 2,5-xylenol and 15 g of oxalic acid dihydrate were charged, and the internal temperature was raised to 95° C. under stirring. Then, 249.3 g of a 37% formalin aqueous solution was dropwise added thereto, and the mixture was reacted for 5 hour while maintaining that temperature. Then, the internal temperature was raised to 180° C. over a period of 1.5 hours to conduct a reaction while distilling water off. After distilling water off, the internal temperature was further raised to 195° C., and unreacted monomers were distilled off under reduced pressure of 20 Torr to obtain a novolak resin (d). The molecular weight of the novolak resin (d) was 5,000.

NOVOLAK RESIN PREPARATION EXAMPLE 5

A novolak resin (e) was prepared in the same manner as in Novolak Resin Preparation Example 1 except that the amounts of acetaldehyde and formalin were changed to 46.8 g of 90% acetaldehyde and 181.2 g of a 37% formalin aqueous solution, respectively. The molecular weight of the novolak resin (e) was 4,000. The ratio of formaldehyde/acetaldehyde (charged molar ratio) was 7/3.

NOVOLAK RESIN PREPARATION EXAMPLE 6

A novolak resin (f) was prepared in the same manner as in Novolak Resin Preparation Example 1 except that the amounts of acetaldehyde and formalin were changed to 85.1 g of 90% acetaldehyde and 141.1 g of a 37% formalin aqueous solution, respectively. The molecular weight of the novolak resin (f) was 3,500. The ratio of formaldehyde/acetaldehyde (charged molar ratio) was 5/5.

NOVOLAK RESIN PREPARATION EXAMPLE 7

A novolak resin (g) was prepared in the same manner as in Novolak Resin Preparation Example 1 except that the amounts of acetaldehyde and formalin were changed to 7.69 g of 90% acetaldehyde and 242.2 g of a 37% formalin aqueous solution, respectively. The molecular weight of the novolak resin (g) was 5,500. The ratio of formaldehyde/acetaldehyde (charged molar ratio) was 95/5.

BALLAST RESIN PREPARATION EXAMPLE 1

A ballast resin (a) was prepared in the same manner as in Novolak Resin Preparation Example 1 except that 475.2 g of m-cresol, 15 g of oxalic acid dihydrate, 1 ml of 35% hydrochloric acid, 26.2 g of 90% acetaldehyde and 174.3 g of a 37% formalin aqueous solution were used. The molecular weight of the ballast resin (a) was 800.

BALLAST RESIN PREPARATION EXAMPLE 2

A ballast resin (b) was prepared in the same manner as in Novolak Resin Preparation Example 4 except that 475.2 g of m-cresol, 15 g of oxalic acid dihydrate, 196.4 g of a 37% formalin aqueous solution were used. The molecular weight of the ballast resin (b) was 986.

BALLAST RESIN PREPARATION EXAMPLE 3

Into a 1 l eggplant-type flask, 324 g of m-cresol, 30 g of oxalic acid dihydrate, 3 ml of 35% hydrochloric acid and 300 ml of ethanol were charged, and 117.5 g of 90% acetaldehyde was dropwise added thereto under stirring at room temperature. Then, the mixture was reacted under reflux for 5 hours while maintaining the oil bath temperature at a level of 100° C. After completion of the reaction, the reaction solution was diluted with 300 ml of ethanol and then dropwise added to 3 l of water to precipitate crystals. Obtained crystals were collected by filtration, washed three times with 3 l of water and then dried to obtain a ballast resin (c). The molecular weight of the ballast resin (c) was 1,058.

PHOTOSENSITIVE MATERIAL PREPARATION EXAMPLE 1

39.4 g of the ballast resin (b) and 58.0 g of 1,2-naphthoquinonediazide-5-sulfonyl chloride were dissolved in a solvent mixture comprising 240 ml of acetone and 65 ml of N-methylpyrrolidone, and 22.1 g of triethylamine was dropwise added thereto. The mixture was reacted at room temperature for two hours. Then, the reaction solution was filtrated to remove triethylamine hydrochloride. The filtrate was added to 1 l of water, and precipitated crystals were collected by filtration, washed with water and dried to obtain a photosensitive material (P-1). The esterification ratio of the photosensitive material (P-1) was 65%.

PHOTOSENSITIVE MATERIAL PREPARATION EXAMPLE 2

A photosensitive material (P-2) was prepared in the same manner as in Photosensitive Material Preparation Example 1 except that 32.3 g of the ballast resin (a) and 35.0 g of 1,2-naphthoquinonediazide-5-sulfonyl chloride were dissolved in a solvent mixture comprising 180 ml of acetone and 50 ml of N-methylpyrrolidone, and 13.4 g of triethylamine was dropwise added thereto. The esterification ratio of the photosensitive material (P-2) was 50%.

PHOTOSENSITIVE MATERIAL PREPARATION EXAMPLE 3

A photosensitive material (P-3) was prepared in the same manner as in Photosensitive Material Preparation Example 1 except that 31.7 g of the ballast resin (c) and 29.0 g of 1,2-naphthoquinonediazide-5-sulfonyl chloride were dissolved in a solvent mixture comprising 160 ml of acetone and 44 ml of N-methylpyrrolidone, and 11.7 g of triethylamine was dropwise added thereto. The esterification ratio of the photosensitive material (P-3) was 45%.

PHOTOSENSITIVE MATERIAL PREPARATION EXAMPLE 4

A photosensitive material (P-4) was prepared in the same manner as in Photosensitive Material Preparation Example 1 except that 12.3 g of 2,3,4,4'-tetrahydroxybenzophenone and 53.7 g of 1,2-naphthoquinonediazide-5-sulfonyl chloride were dissolved in a solvent mixture comprising 200 ml of 1,4-dioxane and 50 ml of N-methylpyrrolidone, and 20.2 g of triethylamine was dropwise added thereto. The esterification ratio of the photosensitive material (P-4) was 100%.

PHOTOSENSITIVE MATERIAL PREPARATION EXAMPLE 5

A photosensitive material (P-5) was prepared in the same manner as in Photosensitive Material Preparation Example 1 except that 12.1 g of 2,2',3,4,4'-pentahydroxybenzophenone and 56.4 g of 1,2-naphthoquinonediazide-5-sulfonyl chloride were dissolved in a solvent mixture comprising 200 ml of 1,4-dioxane and 50 ml of N-methylpyrrolidone, and 23.2 g of triethylamine was dropwise added thereto. The esterification ratio of the photosensitive material (P-5) was 84%.

PHOTOSENSITIVE RESIN COMPOSITION PREPARATION EXAMPLE 1

9.708 g Of the novolak resin (a) as the alkali-soluble resin and 2.542 g of the photosensitive material (P-1) were dissolved in 37.25 g of methyl 3methoxypropionate, and the solution was filtered through a membrane filter having a pore size of 0.2 μm to obtain a photosensitive resin composition (PR-1).

PHOTOSENSITIVE RESIN COMPOSITION PREPARATION EXAMPLES 2 TO 11

Photosensitive resin compositions (PR-2) to (PR-14) were prepared in the same manner as in Photosensitive Resin Composition Preparation Example 1 except that the novolak resins and the photosensitive agents as identified in Table 1 were combined in the proportions as identified in Table 1.

EXAMPLES 1 TO 7 AND COMPARATIVE EXAMPLES 1 TO 4

Photosensitive resin compositions (PR-1) to (PR-14) were subjected to patterning in accordance with the patterning method as described hereinafter, and the sensitivity, the resolution and the exposure margin were evaluated. The results are shown in Table 2. The following symbols and terms used in Table 2 have the following meanings respectively.

Eth: The minimum exposure required to dissolve an exposed portion of 2×2 mm completely to the substrate by an alkali developer, was represented by the exposure time.

$E_0$: The exposure whereby when the line and space patterns on a mask of 0.6 μm were 1:1, after the exposure and development with an alkali developer, the line widths of the exposed portion and the non-exposed portion were obtained at 1:1 with a size of 0.6 μm, was represented by the exposure time. Resolution: The minimum line and space pattern capable of being resolved with an exposure of $E_0$. Exposure margin: The value of $E_0$/Eth.

Patterning method

A photosensitive resin composition was coated on a silicon wafer by a spin coater and heated on a hot plate of 80° C. for 90 seconds to remove the solvent and to form a photoresist coating film having a thickness of 1.22 μm. This coated wafer was subjected to exposure by an i-line stepper (NA=0.5) manufactured by Nikon and then heated on a hot plate of 110° C. for 90 seconds. Then, it was developed by immersing it in a 2.38% tetramethylammonium hydroxide aqueous solution at 23° C. for 60 seconds.

TABLE 1

| | Photosensitive resin compostion No. | Photosensitive material No. | Esterification ratio (%) | Novolak resin No. | Composition of the aldehyde and ketone component* | Weight ratio of the photosensitive material to the novolak resin |
|---|---|---|---|---|---|---|
| Example 1 | PR-1 | P-1 | 65 | a | 8/2 | 0.262 |
| Example 2 | PR-2 | P-3 | 45 | b | 9/1 | 0.461 |
| Example 3 | PR-3 | P-3 | 45 | a | 8/2 | 0.461 |
| Example 4 | PR-4 | P-3 | 45 | c | 8/2 | 0.461 |
| Example 5 | PR-5 | P-2 | 50 | a | 8/2 | 0.394 |
| Example 6 | PR-6 | P-4 | 100 | a | 8/2 | 0.214 |
| Example 7 | PR-7 | P-5 | 84 | a | 8/2 | 0.215 |
| Example 8 | PR-8 | P-3 | 45 | e | 7/3 | 0.461 |
| Example 9 | PR-9 | P-3 | 45 | f | 5/5 | 0.461 |
| Example 10 | PR-10 | P-3 | 45 | g | 95/5 | 0.461 |
| Comparative Example 1 | PR-11 | P-1 | 65 | d | 1/0 | 0.262 |
| Comparative Example 2 | PR-12 | P-3 | 45 | d | 1/0 | 0.461 |
| Comparative Example 3 | PR-13 | P-4 | 100 | d | 1/0 | 0.214 |
| Comparative Example 4 | PR-14 | P-5 | 84 | d | 1/0 | 0.215 |

*Composition of the aldehyde and ketone component: Molar ratio of formaldehyde to the ketone or aldehyde of the formula (B)

TABLE 2

| | Photosensitive resin composition No. | Eth (msec) | $E_0$ (msec) | Resolution (μm) | $E_0$/Eth |
|---|---|---|---|---|---|
| Example 1 | PR-1 | 170 | 328 | 0.38 | 1.93 |
| Example 2 | PR-2 | 230 | 460 | 0.40 | 2.00 |
| Example 3 | PR-3 | 250 | 575 | 0.38 | 2.30 |
| Example 4 | PR-4 | 260 | 629 | 0.38 | 2.42 |
| Example 5 | PR-5 | 185 | 374 | 0.38 | 2.02 |
| Example 6 | PR-6 | 130 | 280 | 0.38 | 2.15 |
| Example 7 | PR-7 | 90 | 181 | 0.38 | 2.01 |
| Example 8 | PR-8 | 255 | 615 | 0.38 | 2.41 |
| Example 9 | PR-9 | 300 | 786 | 0.38 | 2.62 |
| Example 10 | PR-10 | 200 | 370 | 0.40 | 1.85 |

TABLE 2-continued

| Photosensitive resin composition No. | Eth (msec) | E₀ (msec) | Resolution (μm) | E₀/Eth |
|---|---|---|---|---|
| Comparative Example 1 | PR-11 | 110 | 140 | 0.55 | 1.27 |
| Comparative Example 2 | PR-12 | 168 | 291 | 0.45 | 1.70 |
| Comparative Example 3 | PR-13 | 73 | 117 | 0.50 | 1.60 |
| Comparative Example 4 | PR-14 | 66 | 111 | 0.50 | 1.68 |

What is claimed is:

1. A method for forming a pattern on a substrate for a semiconductor, which comprises coating on the substrate a photosensitive resin composition comprising in admixture an alkali-soluble resin, a quinonediazide photosensitive compound and a solvent, as the main components, wherein the alkali-soluble resin is a polycondensation product of (1) a phenolic compound of the formula (A) or a mixture of compounds of formula (A) and (2) aldehydes consisting of (a) formaldehyde and (b) an aldehyde selected from the group consisting of acetaldehyde, propionaldehyde and a mixture thereof, and the mixing ratio of the formaldehyde (a) to the aldehyde (b) is within a range of from 50/50 to 90/10 in terms of the molar ratio of (a)/(b):

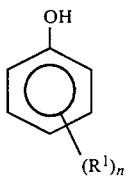
(A)

wherein $R^1$ is a group of the formula $R^2$, $OR^3$, $COOR^4$, $CH_2COOR^5$, wherein $R^2$ is a $C_{1-4}$ alkyl group, each of $R^3$, $R^4$ and $R^5$ which are independent of one another, is a hydrogen atom or a $C_{1-4}$ alkyl group, n is an integer of from 0 to 3, provided that when n is 2 or 3, a plurality of $R^1$ are the same or different, subjecting it to exposure to copy a pattern and developing it to form the pattern.

2. The method according to claim 1, wherein the mixing ratio of the formaldehyde (a) to the aldehyde (b) is within a range of from 50 to 95/5 in terms of the molar ratio of (a)/(b).

3. The method according to claim 1, wherein the mixing ratio of the formaldehyde (a) to the aldehyde (b) is within a range of from 70/30 to 90/10 in terms of the molar ratio of (a)/(b).

4. The method according to claim 1, wherein in the formula (A), $R^1$ is $R^2$, $OR^3$ or $CH_2COOR^5$.

5. The method according to claim 1, wherein in the formula (A), $R^1$ is $R^2$ or $OR^3$, wherein $R^2$ is a $C_{1-2}$ alkyl group, and $R^3$ is a hydrogen atom.

6. The method according to claim 1, wherein the aldehyde is acetaldehyde or propionaldehyde.

7. The method according to claim 1, wherein the aldehyde of the formula (B) is acetaldehyde.

8. The method according to claim 1, wherein the phenolic compound of formula (A) is a mixture of m-cresol, p-cresol, 2,5-xylenol, resorcinol and 2-methylresorcinol, and their mixing ratio is 1–7/1–7/0.1–7/0–2/0–2 in terms of their molar ratio.

9. The method according to claim 1, wherein a mixture of phenolic compound of formula (A) is a mixture of m-cresol, p-cresol, resorcinol and 2-methylresorcinol, and their mixing ratio is 1–7/1–7/0–2/0–2 in terms of their molar ratio.

10. The method according to claim 1, wherein the weight average molecular weight of the alkali-soluble resin as calculated as polystyrene is from 2,500 to 30,000.

11. The photosensitive resin composition according to claim 1, wherein the quinonediazide photosensitive compound is an ester of at least one member selected from the group consisting of 1,2-benzoquinonediazide-4-sulfonic acid, 1,2-naphthoquinonediazide-4-sulfonic acid and 1,2-naphthoquinonediazide-5-sulfonic acid.

12. The photosensitive resin composition according to claim 1, wherein the quinonediazide photosensitive compound is an ester of 1,2-naphthoquinonediazide-5-sulfonic acid.

13. The photosensitive resin composition according to claim 1, wherein the quinonediazide photosensitive compound is an ester of 1,2-naphthoquinonediazide-4-sulfonic acid.

14. The photosensitive resin composition according to claim 1, wherein the quinonediazide photosensitive compound is a quinonediazide sulfonate of at least one compound selected from the group consisting of a polyhydroxyalkyl compound, a polyhydroxyaromatic compound and a phenol resin.

15. The photosensitive resin composition according to claim 1, wherein the quinonediazide photosensitive compound is a quinonediazide sulfonate of a polyhydroxyaromatic compound and/or a phenol resin.

16. The photosensitive resin composition according to claim 1, wherein the quinonediazide photosensitive compound is a quinonediazide sulfonate of at least one compound selected from the group consisting of a polyhydroxybenzophenone, a trisphenol of the following formula (C) and a phenol resin:

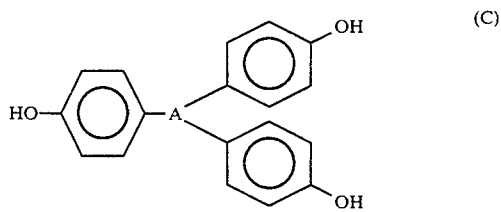
(C)

wherein A is

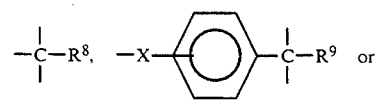

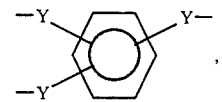

each of $R^8$ and $R^9$ is a hydrogen atom or a $C_{1-4}$ alkyl group, and each of —X— and —Y— is a $C_{1-4}$ alkylene group.

17. The photosensitive resin composition according to claim 1, wherein the quinonediazide photosensitive compound is a 1,2-naphthoquinonediazide-5-sulfonate of polyhydroxybenzophenone, 18. The photosensitive resin composition according to claim 1, wherein the quinonediazide photosensitive compound is a 1,2-naphthoquinonediazide-4-sulfonate of polyhydroxybenzophenone.

19. The photosensitive resin composition according to claim 1, wherein the quinonediazide photosensitive compound is a 1,2-naphthoquinonediazide-5-sulfonate of a phenol resin.

20. The photosensitive resin composition according to claim 1, wherein the quinonediazide photosensitive compound is a 1,2-naphthoquinonediazide-4-sulfonate of a phenol resin.

21. The photosensitive resin composition according to claim 19, wherein the weight average molecular weight of the phenol resin as calculated as polystyrene is from 400 to 2,200.

22. The photosensitive resin composition according to claim 20, wherein the weight average molecular weight of the phenol resin as calculated as polystyrene is from 400 to 2,200.

23. The photosensitive resin composition according to claim 19, wherein the phenol resin is a condensation product of m-cresol with formaldehyde and/or acetaldehyde.

24. The photosensitive resin composition according to claim 20, wherein the phenol resin is a condensation product of m-cresol with formaldehyde and/or acetaldehyde.

25. The photosensitive resin composition according to claim 14, wherein the esterification ratio of the quinonediazide sulfonate is from 30 to 100%.

26. The method for forming a pattern according to claim 1, wherein the exposure is conducted with a light having a wavelength of from 330 to 450 nm.

* * * * *